United States Patent [19]
Hong et al.

[11] Patent Number: 5,627,775
[45] Date of Patent: May 6, 1997

[54] METHOD AND APPARATUS FOR GENERATING RANDOM NUMBERS USING ELECTRICAL NOISE

[75] Inventors: Jung P. Hong; Terry C. Brown, both of Los Alamos, N.M.

[73] Assignee: Applied Computing Systems, Inc., Los Alamos, N.M.

[21] Appl. No.: 423,118

[22] Filed: Apr. 18, 1995

[51] Int. Cl.[6] ............................. G06F 1/02; G06F 7/00; H03B 29/00
[52] U.S. Cl. .................. 364/717; 364/717.5; 331/78; 380/46
[58] Field of Search ..................... 364/717, 717.5, 364/715.01, 718–721; 331/78, 47; 380/46

[56] References Cited

U.S. PATENT DOCUMENTS

| | | | |
|---|---|---|---|
| 3,585,305 | 6/1971 | LaMarche et al. | 364/717 |
| 3,609,201 | 9/1971 | Adachi | 331/78 |
| 3,913,031 | 10/1975 | Membrino | 331/78 |
| 5,157,216 | 10/1992 | Chafe | 331/78 |
| 5,319,715 | 6/1994 | Nagami et al. | 381/71 |
| 5,434,806 | 7/1995 | Hofverberg | 364/717 |

OTHER PUBLICATIONS

R. Sedgewick, Algorithms in C, Chapter 35, pp. 509–519, 1990.

*Primary Examiner*—Paul P. Gordon
*Assistant Examiner*—Emmanuel L. Moise
*Attorney, Agent, or Firm*—Finnegan, Henderson, Farabow, Garrett & Dunner, L.L.P.

[57] ABSTRACT

A random number generating apparatus includes a noise source, a circuit for generating timing signals from the noise source, and a digital circuit that freely and continuously cycles through a predetermined distribution of states. The states of the digital circuit are stored at random times in accordance with the timing signals and are collected to form bytes of random numbers.

20 Claims, 12 Drawing Sheets

5,627,775

METHOD AND APPARATUS FOR GENERATING RANDOM NUMBERS USING ELECTRICAL NOISE

BACKGROUND OF THE INVENTION

1. Field of the Invention

The present invention relates to random number generating methods and apparatus. More particularly, the present invention relates to methods and apparatus for generating nonreproducible, nonperiodic random numbers using electrical noise.

2. Description of the Related Art

Random numbers are useful for a variety of different applications. For example, computer-implemented simulations that model physical objects can receive streams of random numbers as input data to assist in predicting how simulated objects may react or behave in the real world. Random numbers are also useful in the field of data security, where data can be encrypted by combining it with a sequence of random numbers. Decryption of the encrypted data requires knowledge of the sequence of random numbers used for encryption. Thus, the encrypted data remains secure as long as the random numbers used for encryption cannot be ascertained.

Conventionally, random numbers have been generated using known recursive algorithms and techniques, such as the linear congruential method and the additive congruential method. Under these methods, an algorithm uses an arbitrarily-selected initial number, known as a "seed," to produce a first random number. The algorithm then uses each new random number to generate other random numbers.

These conventional random number generators, however, do not produce truly random numbers, but rather "pseudo-random" numbers. Once the algorithm and the seed are known, the numbers produced therefrom are deterministic and thus reproducible.

Also, the algorithms used in the conventional random number generators often produce a series of numbers that eventually repeats. While pseudo-random numbers may be acceptable for a few applications, their use is often less than satisfactory. For example, pseudo-random numbers used in data encryption can be readily reproduced by identifying patterns in encrypted data due to the repetitive nature of pseudo-random numbers. Once the pseudo-random numbers have been reproduced, the encrypted data can be easily decrypted. Thus, it is desirable to generate random numbers that are not reproducible or periodic.

SUMMARY OF INVENTION

Accordingly, the present invention is directed to a random number generating methods and apparatus that substantially obviate one or more of the problems of conventional techniques.

It is an object of the invention to generate random numbers that are nonreproducible and nonperiodic.

It is another object of the invention to generate nonreproducible, nonperiodic random numbers based on desired criteria, such as the range within which the random numbers are generated and the probable likelihoods for selecting the respective values.

It is yet another object of the invention to use a physical input, such as naturally-occurring electrical noise, to generate random numbers.

To achieve these and other advantages and in accordance with the purpose of the invention, as embodied and broadly described below, the invention includes a circuit for generating a nonreproducible, nonperiodic sequence of values, comprising a noise source; means for generating timing signals from the noise source; an independent free-running multistate digital circuit having a predetermined distribution of states; and buffering means for storing states of the digital circuit at random times in accordance with the timing signals.

In another aspect, the invention includes a method of generating random numbers, comprising the steps of generating timing signals from a noise source; continuously activating states of a predetermined distribution of states; and storing values of active states in accordance witch the timing signals.

In yet another aspect, the invention includes a set of numbers generated by a method comprising the steps of generating timing signals from a random characteristic of electrical noise; continuously activating states of a predetermined distribution of states; and storing values of active states in accordance with the timing signals.

Both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the invention and are incorporated in and constitute a part of this specification, illustrate a preferred embodiments of the invention, and, together with the description, serve to explain the principles of the invention.

In the drawings.

DETAILED DESCRIPTION

The method and apparatus of the invention generate random numbers by employing the inherently random behavior of electrical noise. Timing signals are produced from the random variations in electrical noise and are used to generate output signals representative of random numbers. Because the method and apparatus of the invention do not use determinate algorithms like conventional methods and apparatuses, the numbers generated by the method and apparatus of the invention are nonreproducible and nonperiodic.

Figure 1:
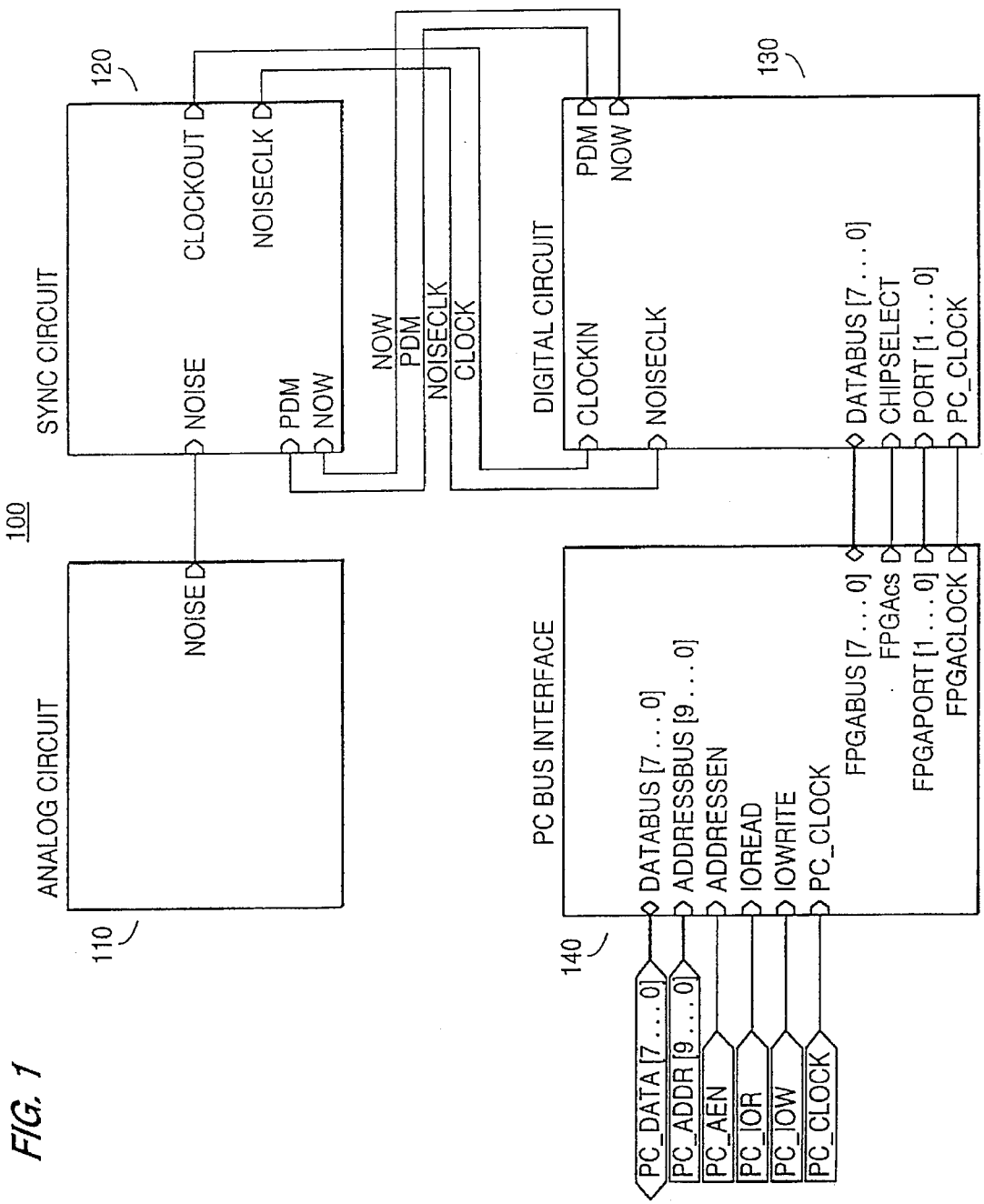
FIG. 1 illustrates a random number generating circuit.

In accordance with a preferred embodiment of the invention, FIG. 1 illustrates a random number generating circuit 100, including analog circuit 110, synchronization circuit 120, digital circuit 130, and PC bus interface 140. As shown in FIG. 1, analog circuit 110 is coupled to synchronization circuit 120, and digital circuit 130 is coupled to both synchronization circuit 120 and PC bus interface 140.

Preferably, circuits 110, 120, and 130 and interface 140 are mounted on a plug-in board suitable for PC ISA bus applications. Random number generating circuit 100 generates random numbers and transmits the random numbers to a PC (not shown) connected to circuit 100 at interface 140 in accordance with control signals received from the PC. A general description of circuits 110, 120, and 130 and interface 140 will be followed by a more detailed description with reference to FIGS. 2–6.

Analog circuit 110 generates a "Noise" signal representing internally-generated electrical noise. As discussed in greater detail below in connection with FIG. 2, analog circuit 110 can include cascaded voltage amplifiers. Preferably, the Noise signal randomly fluctuates above and below a baseline, such as 0 volts, and is band-limited. In a preferred embodiment, the center frequency of the Noise signal is at 1 MHz and the bandwidth is 100 kHz. Because the analog circuit 110 is susceptible to externally-generated noise which might influence the integrity of the Noise signal, analog circuit 110 preferably includes shielding and grounding elements, such as bypass capacitors, for rejecting externally-generated noise.

Synchronization circuit 120 preferably operates in one of two modes: normal operating mode and test mode. The synchronization circuit 120 is set to a mode according to a "Programmable Data Mode (PDM)" signal received from digital circuit 130. In normal operating mode, synchronization circuit 120 synchronizes the Noise signal received from analog circuit 110 with an internally-generated clock signal. The synchronized Noise signal and clock signal are output as "NoiseClk" signal and "Clockout" signal, respectively. In test mode, synchronization circuit 120 ignores the Noise signal and outputs a signal corresponding to test data, the "Now" signal, received from digital circuit 130.

Digital circuit 130 controls the mode in which synchronization circuit 120 operates by outputting a PDM signal to synchronization circuit 120. As discussed above, synchronization circuit 120 may be set to either test mode or normal operating mode. Digital circuit 130 sets the synchronization circuit 120 to test mode based upon control signals and test data received from the PC via interface 140. Digital circuit 130 receives the test data from a multiline Databus and transmits that data to synchronization circuit 120 as the Now signal. Digital circuit 130 sample data using the NoiseClk signal in the same manner as in the normal operating mode. When the sampled data is returned to the PC, the PC can confirm the operability of circuit 100.

When digital circuit 130 sets the synchronization circuit 120 to normal operating mode, digital circuit 130 receives the NoiseClk signal from synchronization circuit 120 to generate random numbers. In a preferred embodiment, the digital circuit 130 uses the NoiseClk signal as a random trigger to sample data from a free-running, multi-state circuit driven by a "ClockIn" signal from the synchronization circuit 120.

Preferably, a multi-state circuit contained in digital circuit 130 has a known distribution of states corresponding to values based on desired criteria, such as the range within which the values fall and the probable likelihoods for selecting the respective values. As the multi-state circuit cycles through its states, the NoiseClk signal specifies when to sample data from the circuit. Because the NoiseClk signal becomes high randomly, the sampled value is random. Digital circuit 130 collects the sampled data into a buffer, such as a register, and outputs the buffered data onto a multiline "DataBus" based on command signals received from PC bus interface 140. These command signals may include a "ChipSelect" signal, a "Port" signal, and a "PC_Clock" signal, described in greater detail below.

PC bus interface 140 links a PC to the digital circuit 130 to provide the random numbers from the digital circuit 130 to the PC. Preferably, PC bus interface 14:0 receives random numbers from the digital circuit 130 and transmits the random numbers to the PC in accordance with command signals received from the PC.

In this way, the random number generating circuit 100 generates random numbers using electrical noise rather than deterministic algorithms, which can only produce pseudorandom numbers. The circuits 110, 120, and 130 and the interface 140 will now be described in greater detail.

Figure 2:
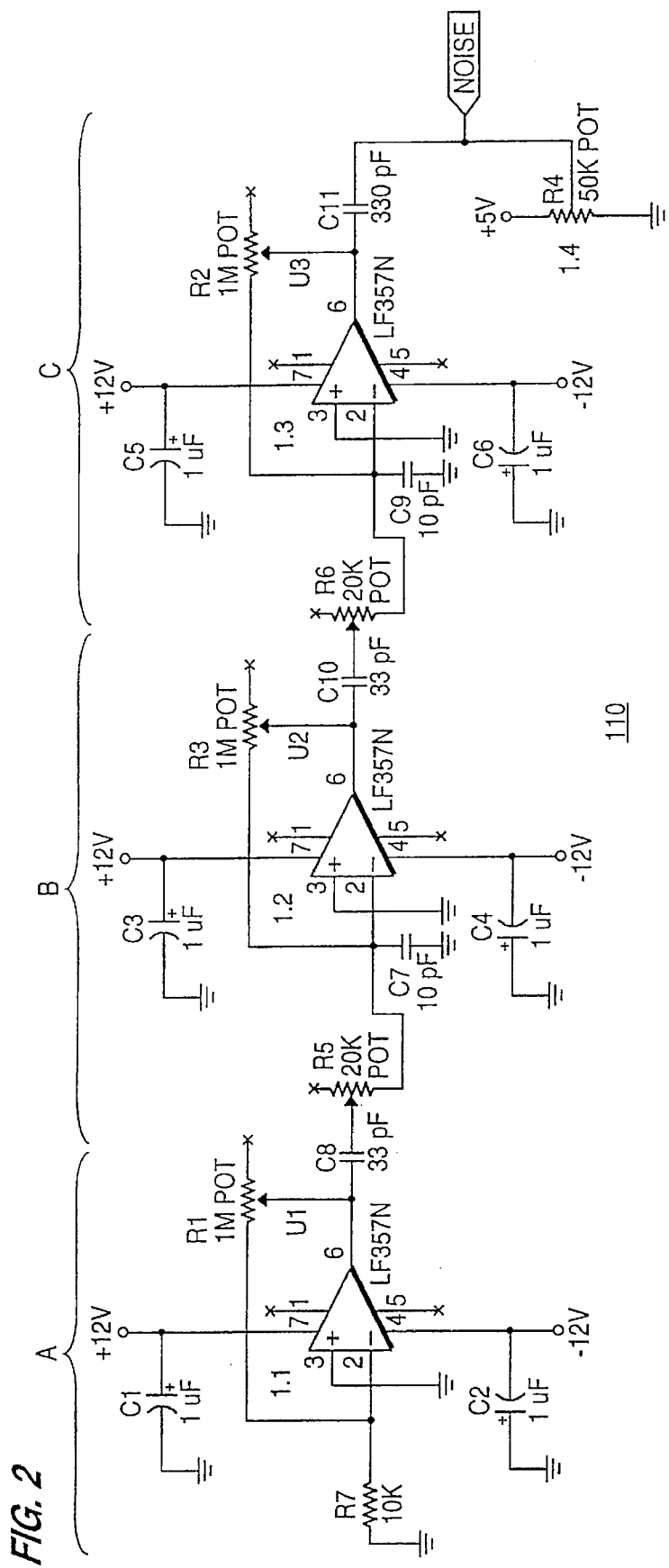
FIG. 2 illustrates an analog circuit used in the random number generating circuit shown in FIG. 1.

FIG. 2 illustrates analog circuit 110 in accordance with a preferred embodiment of the invention. As shown in FIG. 2, circuit 110 comprises three cascaded amplifiers denoted as A, B, and C, respectively. Amplifiers A, B, and C comprise operational amplifier circuits connected to various electrical components, such as resistors and capacitors, the preferred values of which are shown in FIG. 2. In alternative embodiments, different components values and circuit configurations can be used based upon design needs and considerations.

In the embodiment shown in FIG. 2, amplifier A amplifies internal noise inherently present approximately 100 times and transmits the amplified noise to amplifier B. Amplifier B amplifies the noise received from amplifier A approximately 100 more times, bandpass filters the amplified noise at a center frequency of 1 MHz and width of appropriately 100 kHz, and transmits the amplified, filtered noise to amplifier C. Like amplifier B, amplifier C amplifies and bandpass filters the noise received from amplifier B and outputs it as "Noise" signal. The waveform of the Noise signal approximates a signal with a frequency that varies randomly within the frequency band permitted by the filter.

The amplifiers collectively amplify the internal noise to produce a final output (e.g., Noise signal) that can adequately drive the synchronization circuit 120. Further, amplifiers B and C filter the noise to allow the use of common circuit components and to reject high frequency noise produced by the PC.

As explained above, the high amplification produced by circuit 110 (e.g., in the preferred embodiment, approximately 1,000,000 times) makes circuit 110 susceptible to external noise affecting its output. Typically, the external noise is more deterministic than the naturally-occurring internal noise and thus is undesirable. To minimize the effect of external noise, circuit 110 can include shielding and grounding for rejecting external noise. For example, bypass capacitors (not shown in FIG. 2) can be used to reject external noise. Also, circuit 110 can be enclosed in an EMI shield to block external noise.

Figure 3:
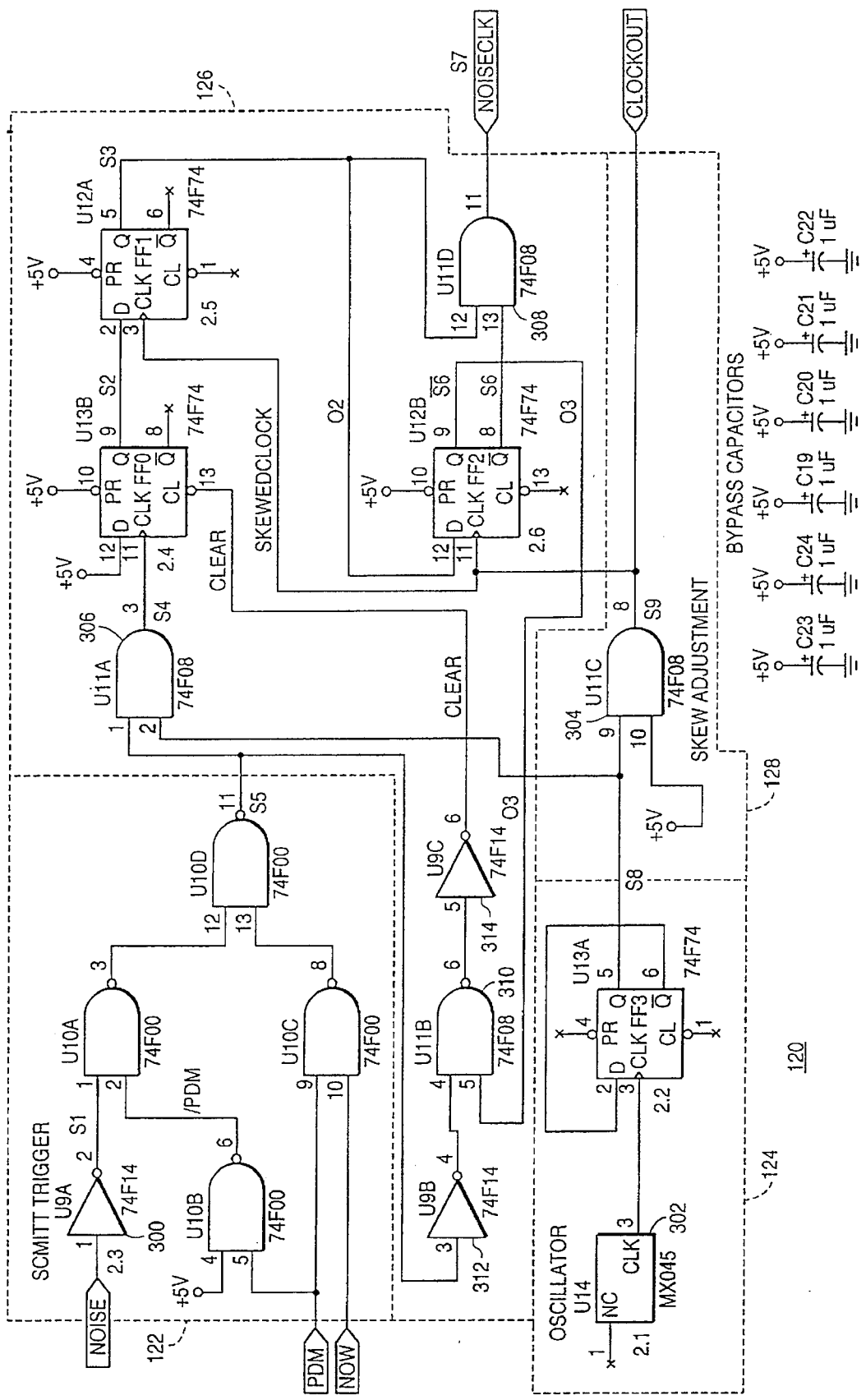
FIG. 3 illustrates a synchronization circuit used in the random number generating circuit shown in FIG. 1.

FIG. 3 illustrates synchronization circuit 120 in accordance with a preferred embodiment of the invention, including a combination of electrical components, flip-flops FF1–FF4, and an oscillator 302. As shown in FIG. 3, circuit 120 can be divided into sections 122, 124, 126, and 128. In addition, FIG. 3 shows circuit 120 further including bypass capacitors for rejecting external noise from interfering with the signals transmitted within circuit 120.

Section 122 receives the Noise signal from analog circuit 110 and PDM signal and Now signal from digital circuit 130. Section 122 includes several NAND gates and a Schmitt trigger 300 that converts the analog Noise signal to a digital signal S1. Schmitt trigger 300 and NAND gates are arranged such that, if the PDM signal is low, then signal S5 output from section 122 corresponds to the Noise signal. If the PDM signal is high, then signal S5 output from section 122 corresponds to the Now signal.

Section 124 provides an oscillating signal to sections 126 and 128. As shown in FIG. 3, section 124 preferably includes an oscillator 302 and D flip-flop FF3. Oscillator 302 outputs an oscillating signal of, for example, 64 MHz to the clock input of flip-flop FF3. Input D of flip-flop FF3 is connected to output $\overline{Q}$ (hereinafter referred to as "Q not") so that output Q produces an oscillating signal S8 having a frequency of 32 MHz (e.g., half of the frequency output by oscillator 302).

Section 128 outputs a ClockOut signal S9, which represents the oscillating signal S8 with a skew adjustment. Section 128 preferably includes AND gate 304, which receives signal S8 from section 124 and outputs signal S9. Although signal S9 follows the waveform of signal S8, the delay inherent in electronic logic causes signal S9 to be slightly skewed from signal S8.

Section 126 synchronizes the signal S5 from section 122 with the clock signal S8 from section 124 and outputs the synchronized signal as NoiseClk signal S7. As shown in FIG. 3, in a preferred embodiment, section 126 includes AND gates 306, 308, 310, inverters 312, 314, and flip-flops FF0, FF1, FF2.

The components of section 126 are connected as follows. AND gate 306 receives signal S5 and signal S8 to produce signal S4, which serves as the clock input for flip-flop FF0. Output Q of flip-flop FF0 is connected to input D of flip-flop FF1, whose output Q is connected to input D of flip-flop FF2 and an input of AND gate 308. The clock inputs of flip-flops FF1 and FF2 are connected to signal S9 from section 128. Output (Q not) of flip-flop FF2 is connected to another input of AND gate 308, which outputs NoiseClk signal S7. AND gate 310 receives an inverted signal S5 from inverter 312 and signal (S6 not) from output Q of flip-flop FF2 and outputs the combined signal to inverter 314, whose output is connected to the clear input of flip-flop FF0.

Under this arrangement, signal S4 represents oscillating signal S8 combined with signal S5. Signal S2 output from flip-flop FF0 becomes high when signal S4 is high and stays high until flip-flop FF0 receives a clear signal. Flip-flops FF1 and FF2 output signal S3 and signal (S6 not), respectively, both of which are time delayed from signal S2, to form NoiseClk signal S7, which becomes high for only one clock cycle and is synchronized with the skewed signal S9. When signal (S6 not) from flip-flop FF2 is high, a clear signal is formed when signal S5 is low so that flip-flop FF0 is reset and awaits for signal S5 to become high again.

Figure 4:
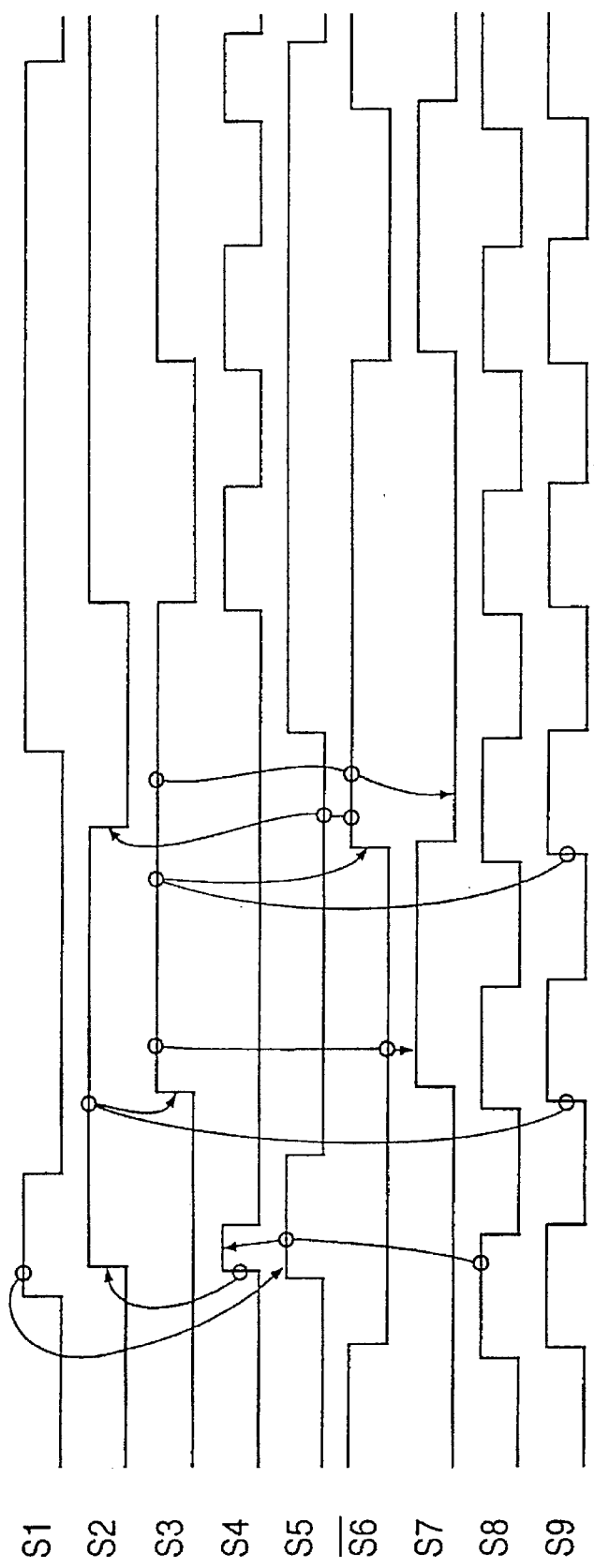
FIG. 4 is a timing diagram of signals in the synchronization circuit shown in FIG. 3.

The synchronization of the signals of section 126 may be better understood from the timing diagram shown in FIG. 4. In the timing diagram, the PDM signal is assumed to be low so that circuit 120 is set to normal operating mode. Thus, signal S5 output from section 122 follows digital signal S1, which corresponds to the Noise signal. Signal S4 is formed by combining signal S5 and oscillating signal S8. When signal S4 transitions high, output signal S2 of flip-flop FF0 transitions high and remains high until a clear signal is received by flip-flop FF0. Signal S2 is fed into input D of flip-flop FF1, which is driven by skewed clock signal S9. Flip-flop FF1 outputs signal S3, which becomes high approximately one clock cycle after signal S2 becomes high. At that time, signal S7 becomes high since signals S3 and S6 are both high. Approximately one clock cycle later, signal (S6 not) becomes high, and therefore signal S6 becomes low. Thus, signal S7 becomes low and, when S5 is low, a clear signal is formed to reset flip-flop FF0.

From this arrangement of elements, the synchronization circuit 120 generates NoiseClk signal having a pulse width of one clock cycle and in phase with the skewed signal S9.

Figure 5:
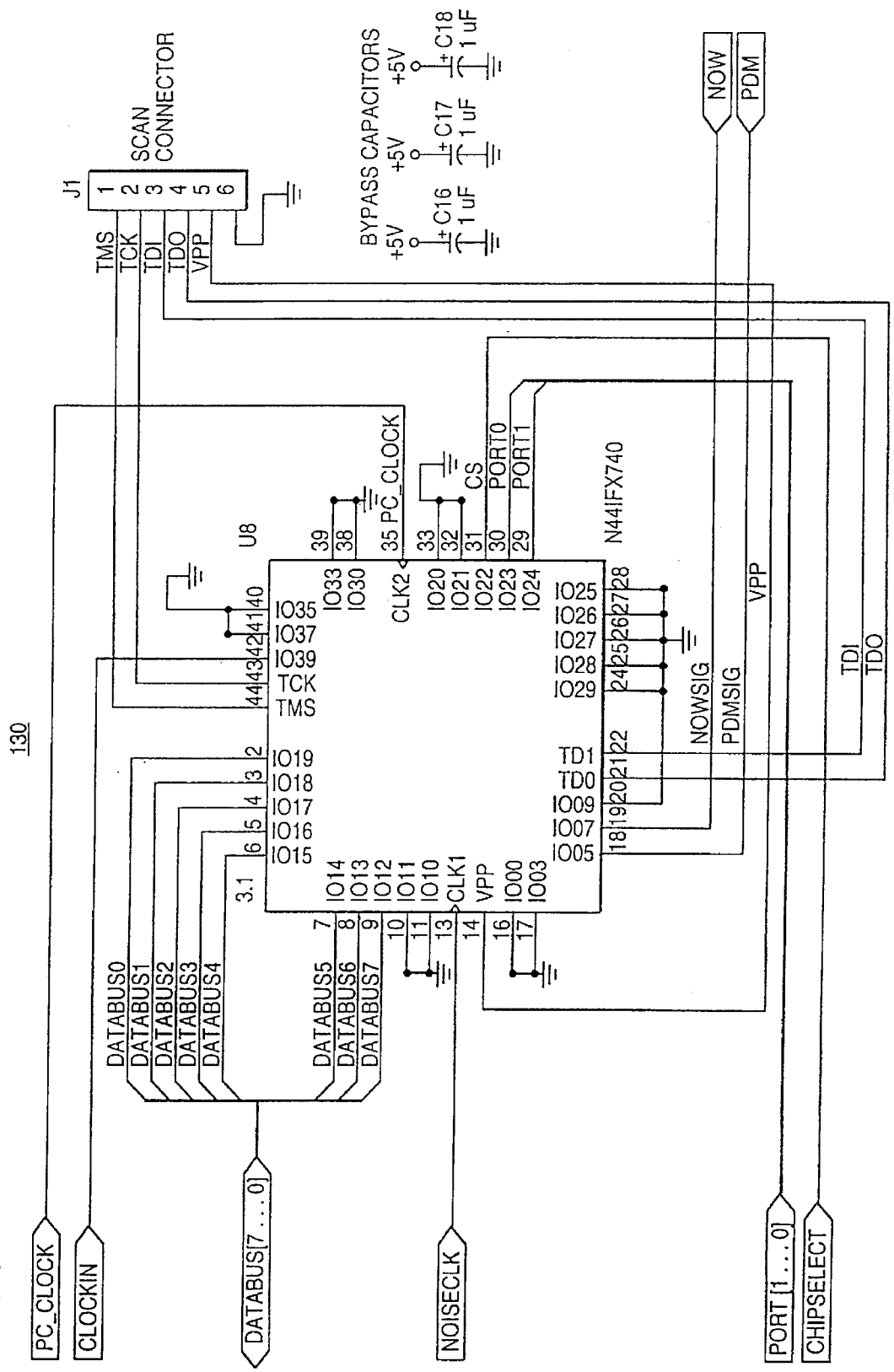
FIG. 5 illustrates a digital circuit used in the random number generating circuit shown in FIG. 1.

FIG. 5 illustrates digital circuit 130 in accordance with a preferred embodiment of the invention. The digital circuit 130 receives a ClockIn signal and a NoiseClk signal and outputs a PDM signal and a Now signal. Digital circuit 130 also receives control signals and, when appropriate, test data from the PC via interface 140.

Digital circuit 130 preferably comprises a programmable logic device that is programmed to generate bytes of random numbers from the ClockIn signal and NoiseClk signal. An exemplary computer program listing which can be loaded into the programmable logic device to perform the necessary functions is provided in the attached Appendix. In addition, circuit 130 further comprises bypass capacitors for rejecting external noise from interfering with the signals transmitted within circuit 130.

As discussed in greater detail below, the PC can access data from digital circuit 130 via three different ports: a command port, a status port, and a data port. In a preferred embodiment, digital circuit 130 is programmed to include a command decoder module, an eight-bit register module, a counter module, a clock divider module, and a free-running toggle flip-flop module.

The clock divider module creates a clock signal by, for example, dividing the frequency of the ClockIn signal on circuit 130 in half. Thus, if the ClockIn signal has a frequency of 32 MHz, then the clock signal created by the clock divider is 16 MHz. This clock signal drives the toggle flip-flop module. In one embodiment, the flip-flop module alternates between a "0" state and a "1" state. When the NoiseClk signal becomes high, the eight-bit register module stores the current state of the flip-flop module (e.g., either 1 or 0) into its lowest bit, the eight-bit register module shifts the other bits, and the counter module is incremented. Since the NoiseClk signal becomes high at random times, the value stored in the register module is random.

When the counter module reaches a count of eight, the command decoder module determines that the register module is full and sets an internal Ready signal which is transmitted to the PC via the status port when the PC requests status. When the internal Ready signal is set, the eight-bit register module ignores the NoiseClk signal and does not store any new values into the eight-bit register module until the PC has read the data. When the PC is ready, it reads the data from the eight-bit register module via the data port and transmits a Reset command and an Enable command to the digital circuit 130 via the command port. When the command decoder module receives these commands, it resets the register and enables the circuit to store the next 8 random bits.

In an alternative embodiment, toggle flip-flop module can be replaced by a multi-state module having more than two states. In this way, the distribution of the states can be set in accordance with desired criteria, such as the range within which the values fall and the probable likelihoods for selecting the respective values. For example, if it is desired that the value "0" be selected approximately one-third of the time and the value "1" approximately two-thirds of the time, then the multi-state module could be formed with three states, one having a value of "0" and the other two having a value of "1".

Figure 6:
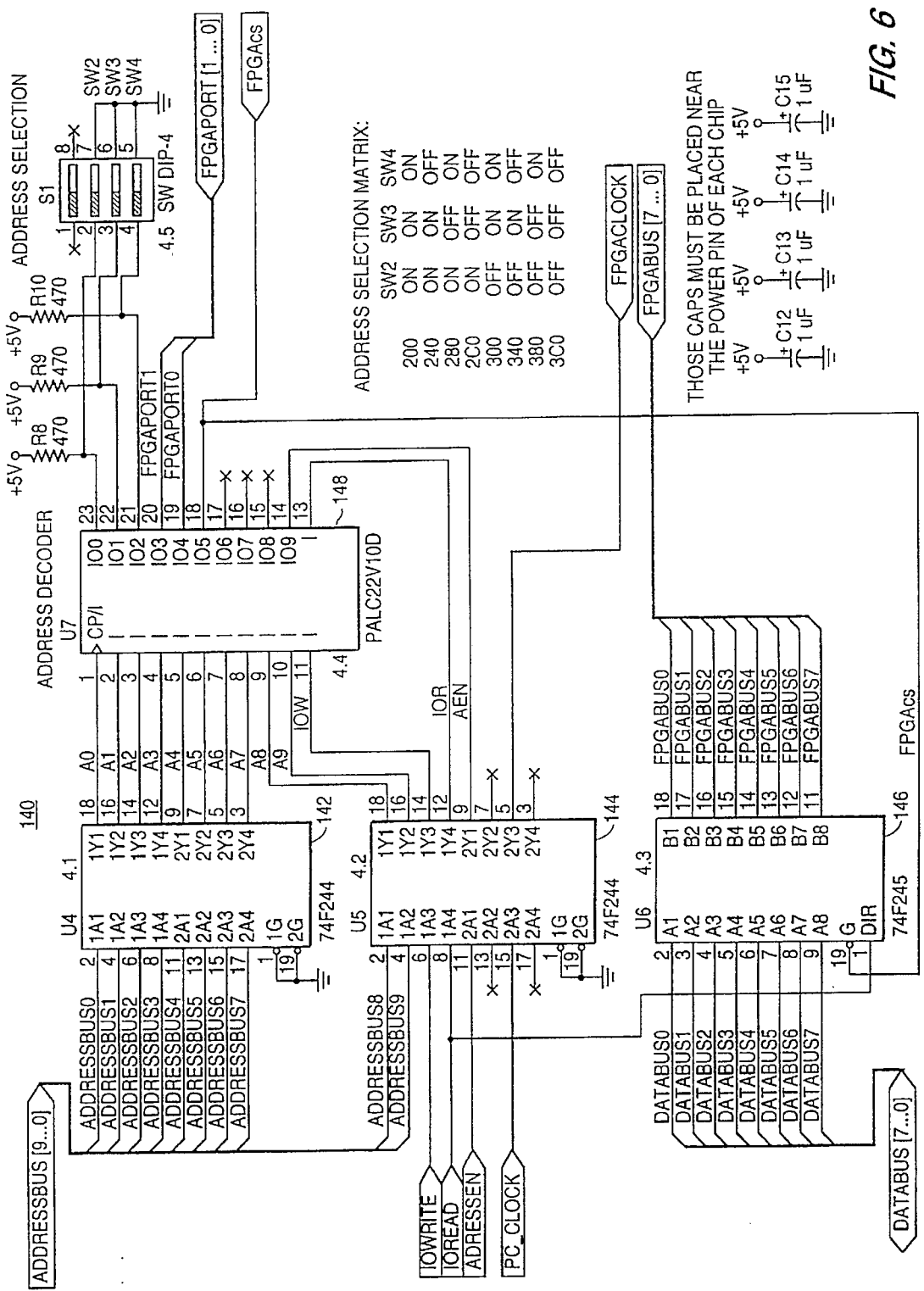
FIG. 6 illustrates a PC bus interface used in the random number generating circuit shown in FIG. 1.

FIG. 6 illustrates PC bus interface 140 in accordance with a preferred embodiment of the invention, including address decoder 148 and buffers 142, 144, and 146, each connected to the address decoder 148. In addition, FIG. 6 shows interface 140 further including bypass capacitors for rejecting external noise from interfering with the signals transmitted within interface 140.

Address decoder 148 serves to translate the ISA bus signals from the PC via buffers 142 and 144 into port addresses that the digital circuit 130 can recognize. The decoder 148 preferably blocks inappropriate port accesses by qualifying the port address with a chip select signal, FPGAcs. When the FPGAcs signal is not active, digital circuit 130 cannot access the ISA bus.

Buffer 144 receives command signals from the PC and transmits those signals to the decoder 148. Decoder 148 translates these command signals into command signals understandable by digital circuit 130. Buffer 146 receives data from the digital circuit for transmittal to the PC and vice-versa. Using these buffers, the PC is isolated from the digital circuit 130 and receives data when it requests it through the issuance of command signals.

As described above, circuit 100 generates bytes of random numbers by exploiting the random nature of electrical noise. By avoiding deterministic algorithms, the random numbers are neither reproducible nor periodic.

Figure 7:
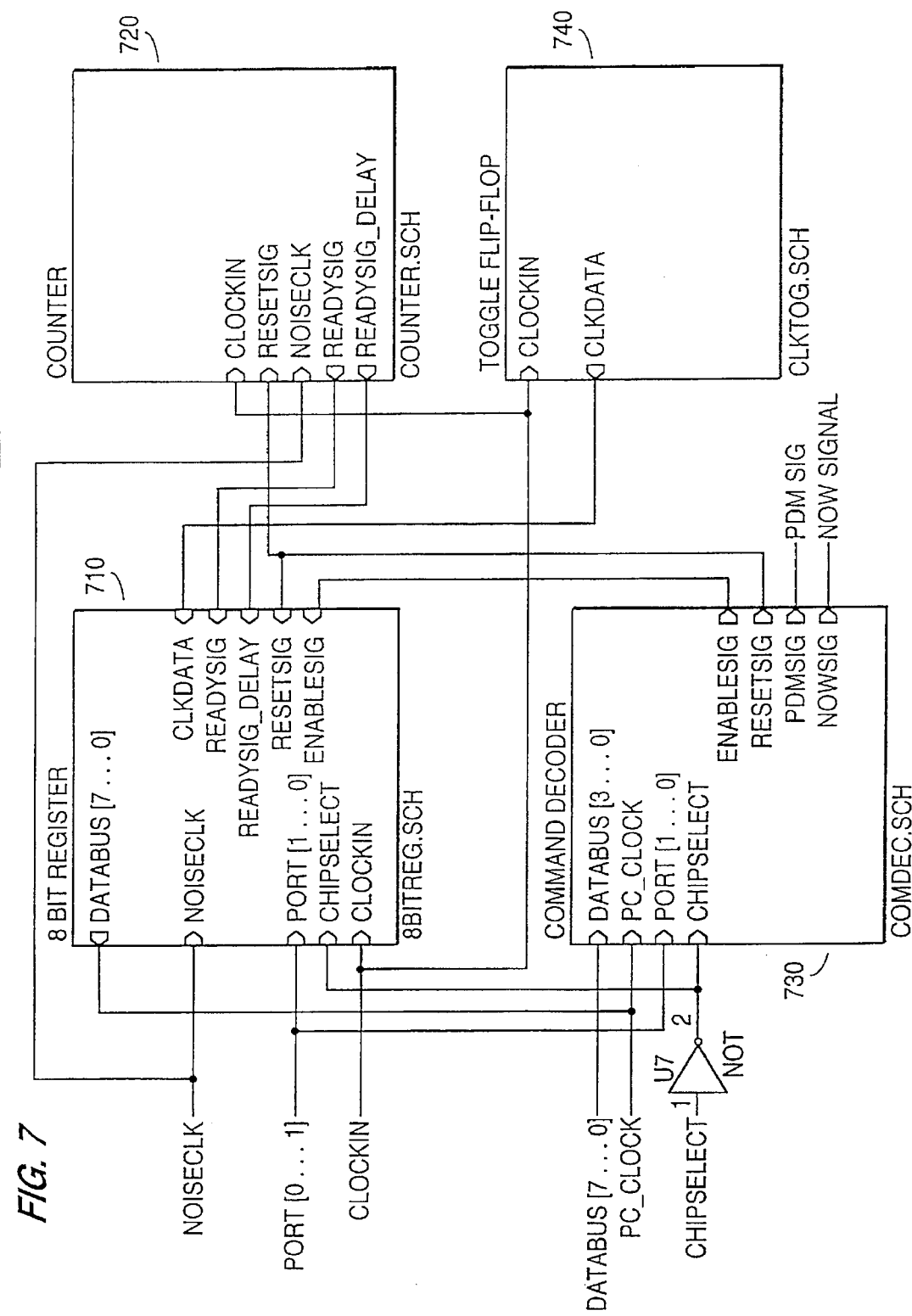
FIG. 7 illustrates a digital circuit used in the random number generating circuit shown in FIG. 1 in accordance with a second embodiment of the invention.

Of course, the circuit 100 as described above can be implemented with various modifications and variations. For example, in an alternative embodiment, the digital circuit 130 can be implemented as electronic circuitry rather than as a programmable logic device. As shown in FIG. 7, digital circuit 700 comprises an 8-bit register 710, a counter 720, a command decoder 730, and a toggle flip-flop 740. Because these components are similar to the modules of digital circuit 130 described above, the components will only briefly be described. Reference is made to the above-description of the corresponding modules for a more detailed understanding of the components.

As shown in FIG. 7, flip-flop 740 is driven by ClockIn and provides an alternating output to 8-bit register 710. The 8-bit register 710 receives the NoiseClk signal and stores the current state of the flip-flop 740 when the NoiseClk signal becomes high. Counter 720 receives the NoiseClk signal and increments each time the NoiseClk signal becomes high. When counter 720 reaches a count of eight, counter 720 transmits a signal to the 8-bit register 710. The 8-bit register 710 outputs the byte of data onto the DataBus when it has received a Ready signal from counter 720 and the command signals from the PC. The 8-bit register 710 resumes storing data when it receives an enable signal from the command decoder 730.

Figure 8:
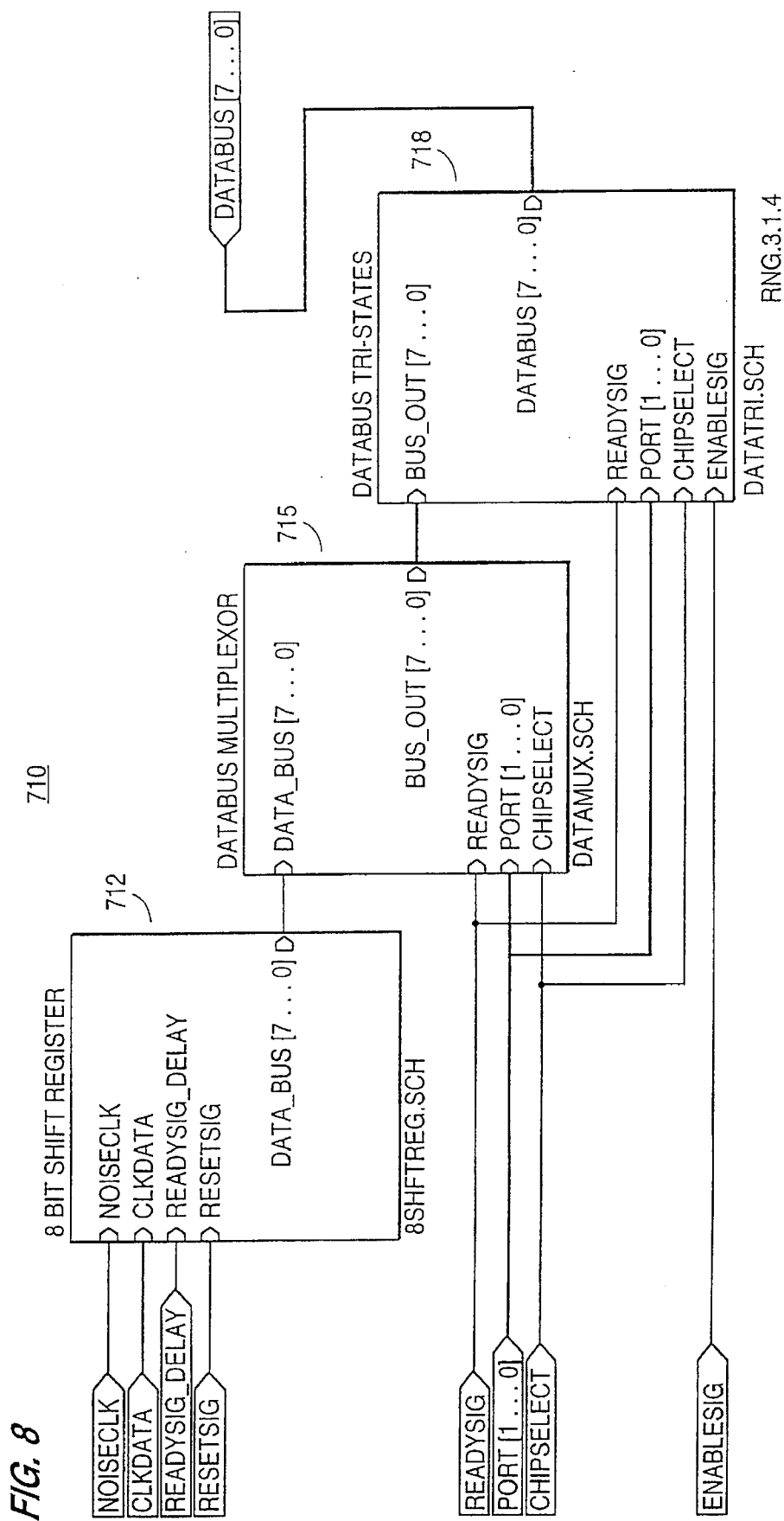
FIG. 8 illustrates an 8-bit: register of the digital circuit shown in FIG. 7.
Figure 9:
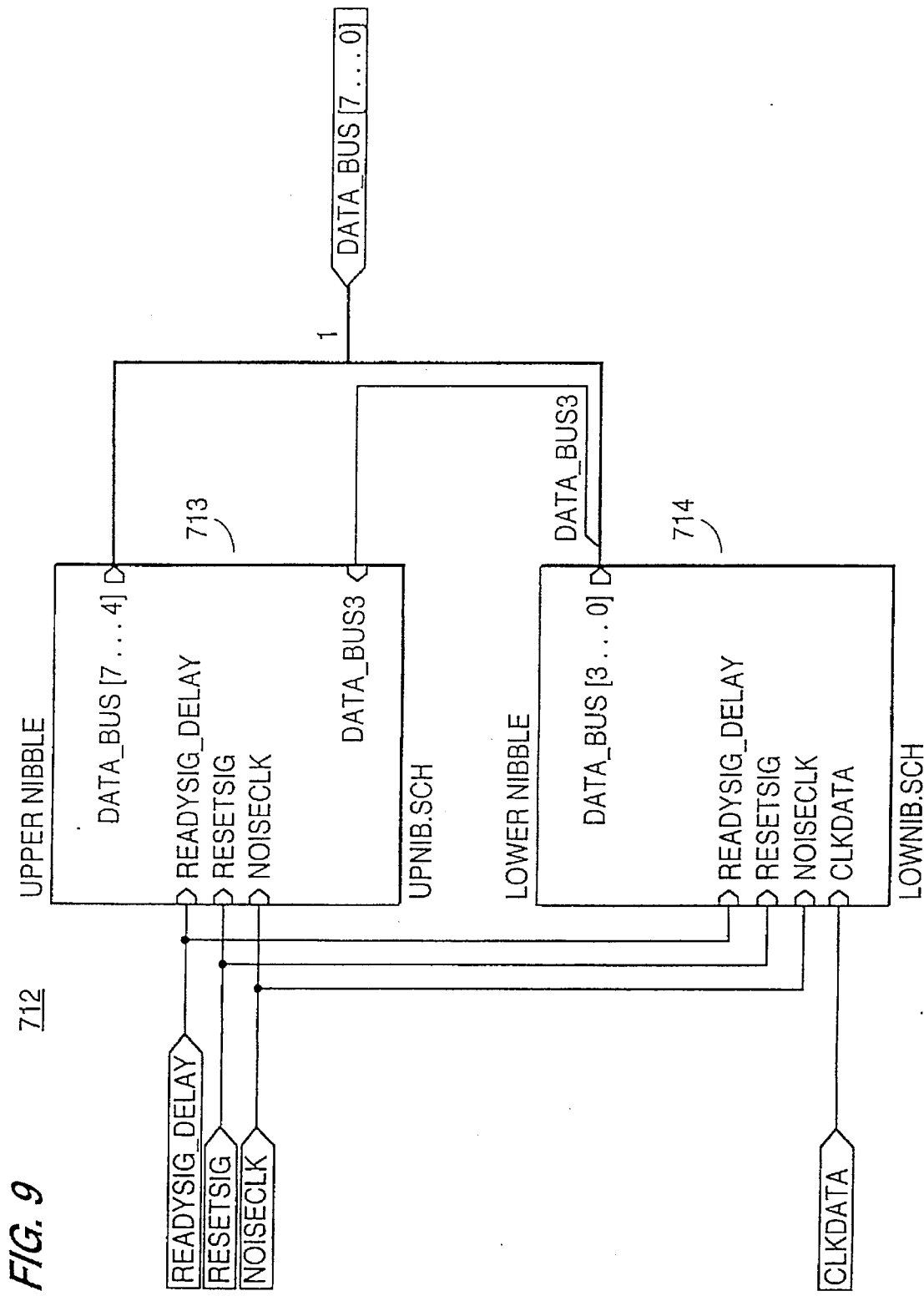
FIG. 9 illustrates an 8-bit shift register of the 8-bit register shown in FIG. 8.
Figure 10:
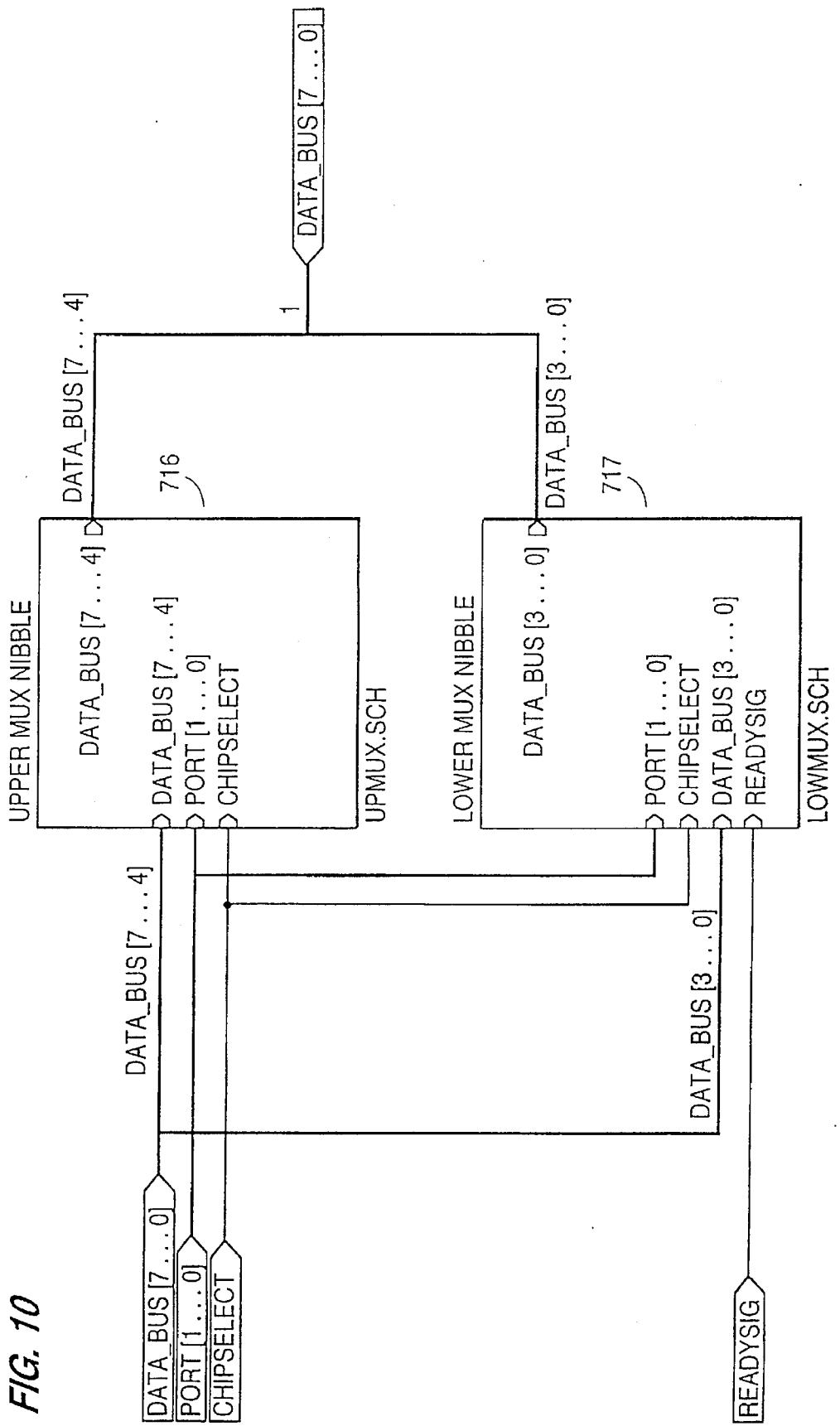
FIG. 10 illustrates a databus multiplexor of the 8-bit register shown in FIG. 8.

FIG. 8 illustrates 8-bit register 710 comprising an 8-bit shift register 712, a databus multiplexor 715, and a databus tri-states 718. In accordance with the NoiseClk signal, the 8-bit shift register 712 shifts data from the ClkData signal into an upper nibble 713 and a lower nibble 714, as shown in FIG. 9. When the 8-bit shift register 712 receives a readysig_delay signal from counter 720, 8-bit shift register 712 outputs its data to databus multiplexor 715 comprising an upper mux nibble 716 and a lower mux nibble 717, as shown in FIG. 10. When the databus multiplexor 715 receives a readysig signal and a chipselect signal, the databus multiplexor 715 outputs the data to databus tri-states 718, which places the data onto the DataBus when the chipselect signal is active.

Figure 11:
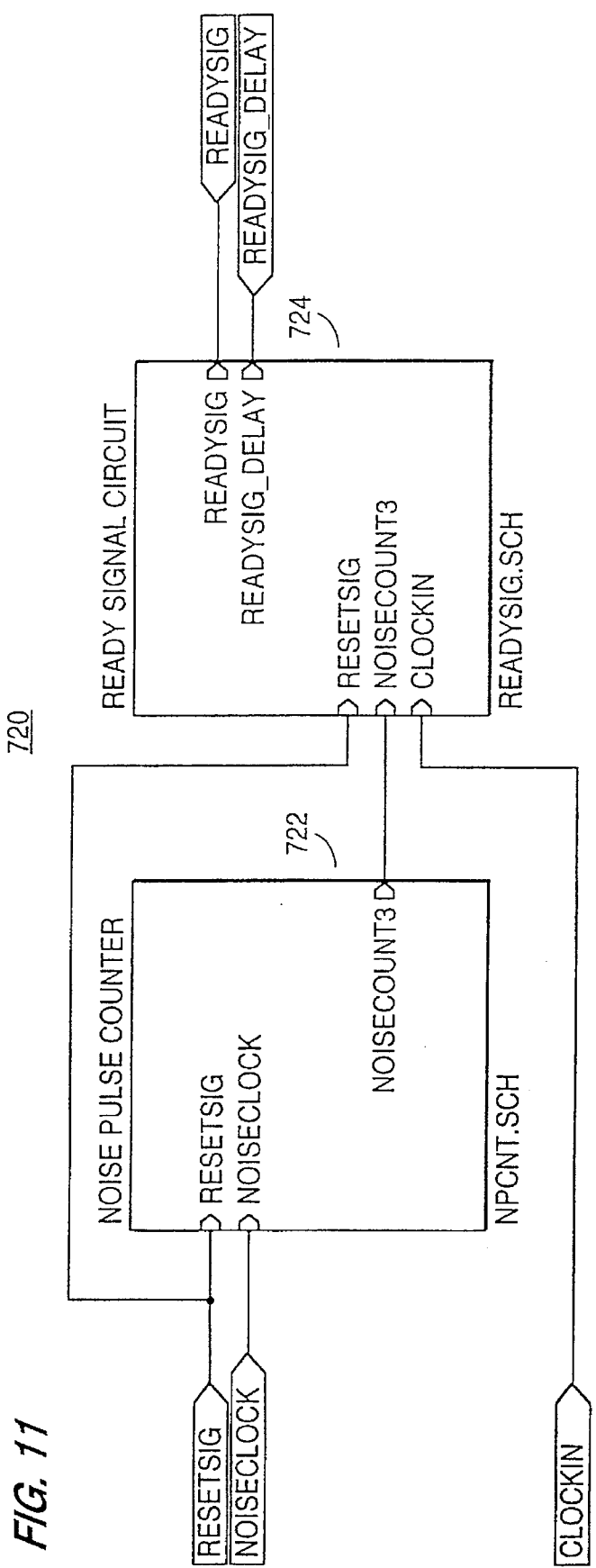
FIG. 11 illustrates a counter of the digital circuit shown in FIG. 7.

FIG. 11 illustrates counter 720 comprising a noise pulse counter 722 and a ready signal circuit 724. The noise pulse counter 722 increments each time the NoiseClk signal goes high and resets upon receipt of the resetsig signal. When counter 722 reaches a predetermined count (e.g., 8), counter 722 informs the ready signal circuit 724, which generates a readysig_delay signal in response. When ready signal circuit 724 also receives a ClockIn signal, ready signal circuit 724 generates a readysig signal indicating that the data from the 8-bit register 710 can be output onto the DataBus.

Figure 12:
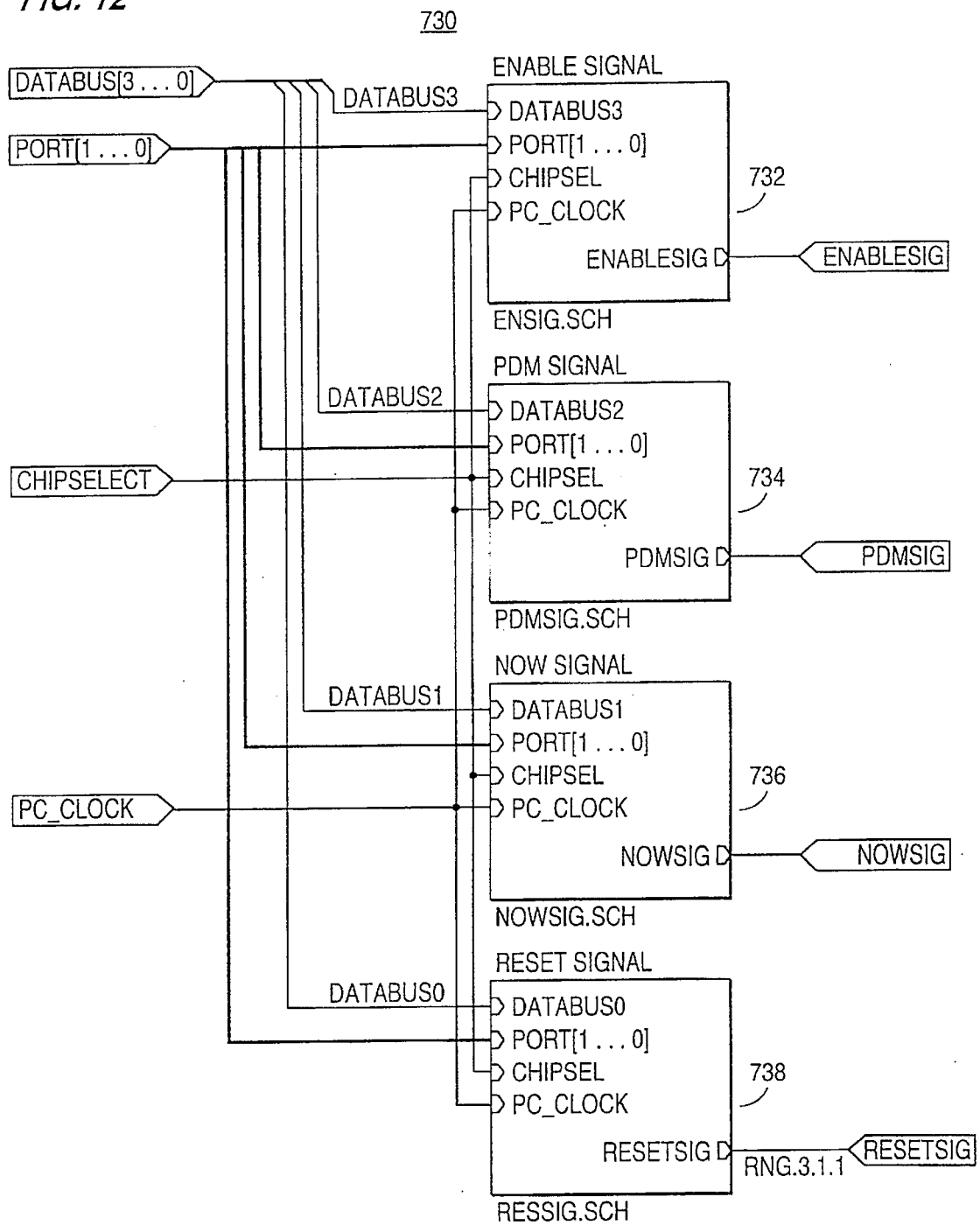
FIG. 12 illustrates a command decoder of the digital circuit shown in FIG. 7.

FIG. 12 illustrates command decoder 730, which includes an enable signal module 732, a PDM signal module 734, a Now signal module 736, and a reset signal module 738. These modules receive command signals from the PC via the DataBus and output respective internal command signals. For example, the enable signal module 732 generates an internal enable signal when it receives an enable signal from the PC. In another example, the PDM module 734 generates an internal PDM signal when it receives a PDM signal from the PC. The internal command signals generated by the modules are transmitted to the appropriate circuits in the random number generating circuit 100.

Thus, it will be apparent to those skilled in the art that various modifications and variations can be made in the random number generating method and apparatus of the present invention without departing from the spirit or scope of the invention. The present invention covers the modifications and variations of this invention provided they come within the scope of the appended claims and their equivalents.

APPENDIX

```
1    ; Copyright 1995 Applied Computing Systems, Inc.   All rights reserved.
2
3    TITLE   RANDOM NUMBER DIGITAL CIRUIT, 8 BIT
4    AUTHOR  TERRY BROWN
5    COMPANY APPLIED COMPUTING SYSTEMS
6
7    CHIP    RANDOM8    fx740_44
8
9
10   ; Input and Output Assignments
11
12   PIN      29    portaddr_1_
13   PIN      30    portaddr_0_
14   PIN      31    /chipsel
15   PIN       9    pc_data_bus_7_
16   PIN       8    pc_data_bus_6_
17   PIN       7    pc_data_bus_5_
18   PIN       6    pc_data_bus_4_
19   PIN       5    pc_data_bus_3_
20   PIN       4    pc_data_bus_2_
21   PIN       3    pc_data_bus_1_
22   PIN       2    pc_data_bus_0_
23   PIN      35    pc_clock
24   PIN      42    clock
25   PIN      13    noiseclock
26   PIN      18    pdmsig
27   PIN      19    nowsig
28
29
30   ; Internal Signals
31
32   NODE    enablesig
33   NODE    regclknxtcycle
34   NODE    resetsig
35   NODE    noisecnt_3
36   NODE    noisecnt_2
37   NODE    noisecnt_1
38   NODE    noisecnt_0
39   NODE    clkdata
40   NODE    readysig_delay
41   NODE    readysig
42   NODE    data_bus_7
43   NODE    data_bus_6
44   NODE    data_bus_5
45   NODE    data_bus_4
46   NODE    data_bus_3
47   NODE    data_bus_2
48   NODE    data_bus_1
49   NODE    data_bus_0
50   NODE    bus_out_7_
51   NODE    bus_out_6_
52   NODE    bus_out_5_
53   NODE    bus_out_4_
54   NODE    bus_out_3_
55   NODE    bus_out_2_
56   NODE    bus_out_1_
```

```
57    NODE    bus_out_0_
58    NODE    pcnowsig
59    NODE    pcpdmsig
60    NODE    pcenablesig
61    NODE    pcresetsig
62
63
64    EQUATIONS
65
66    ; RNG.3.1.1.1
67
68        enablesig.D := pcenablesig
69        enablesig.CLKF = pc_clock
70
71        pcenablesig = chipsel * portaddr_1_ * /portaddr_0_ * pc_data_bus_3_
72              :+: pcenablesig * portaddr_0_ + pcenablesig * /portaddr_1_
73              + pcenablesig * /chipsel
74
75    ; RNG.3.1.1.2
76
77        pdmsig.D := pcpdmsig
78        pdmsig.CLKF = pc_clock
79
80        pcpdmsig = chipsel * portaddr_1_ * /portaddr_0_ * pc_data_bus_2_
81              :+: pcpdmsig * portaddr_0_ + pcpdmsig * /portaddr_1_
82              + pcpdmsig * /chipsel
83
84    ; RNG.3.1.1.3
85
86        nowsig.D := pcnowsig
87        nowsig.CLKF = pc_clock
88
89        pcnowsig = chipsel * portaddr_1_ * /portaddr_0_ * pc_data_bus_1_
90              :+: pcnowsig * portaddr_0_ + pcnowsig * /portaddr_1_
91              + pcnowsig * /chipsel
92
93    ; RNG.3.1.1.4
94
95        resetsig.D := pcresetsig
96        resetsig.CLKF = pc_clock
97
98        pcresetsig = chipsel * portaddr_1_ * /portaddr_0_ * pc_data_bus_0_
99              :+: pcresetsig * portaddr_0_ + pcresetsig * /portaddr_1_
100             + pcresetsig * /chipsel
101
102   ; RNG.3.1.2
103
104       clkdata.D := /clkdata
105       clkdata.CLKF = /clock
106
107   ; RNG.3.1.3.1
108
109       noisecnt_3.D := noisecnt_3 + noisecnt_0 * noisecnt_1 * noisecnt_2
110
111       /noisecnt_3.RSTF = /resetsig
112       noisecnt_3.CLKF = noiseclock
```

```
113
114         noisecnt_2.D := noisecnt_2 :+: noisecnt_0 * noisecnt_1
115         /noisecnt_2.RSTF = /resetsig
116         noisecnt_2.CLKF = noiseclock
117
118         noisecnt_1.D := noisecnt_1 :+: noisecnt_0
119         /noisecnt_1.RSTF = /resetsig
120         noisecnt_1.CLKF = noiseclock
121
122         noisecnt_0.D := /noisecnt_0
123         /noisecnt_0.RSTF = /resetsig
124         noisecnt_0.CLKF = noiseclock
125
126     ; RNG.3.1.3.2
127
128         readysig.D := noisecnt_3 * regclknxtcycle
129         /readysig.RSTF = /resetsig
130         readysig.CLKF = clock
131
132         readysig_delay.D := readysig
133         readysig_delay.CLKF = clock
134
135         regclknxtcycle.D := noisecnt_3
136         regclknxtcycle.CLKF = clock
137
138     ; RNG.3.1.4.1.1
139
140         data_bus_7.D := data_bus_6 * /readysig_delay + data_bus_7 * readysig_delay
141         /data_bus_7.RSTF = /resetsig
142
143         data_bus_7.CLKF = noiseclock
144         data_bus_6.D := data_bus_5 * /readysig_delay + data_bus_6 * readysig_delay
145         /data_bus_6.RSTF = /resetsig
146
147         data_bus_6.CLKF = noiseclock
148         data_bus_5.D := data_bus_4 * /readysig_delay + data_bus_5 * readysig_delay
149         /data_bus_5.RSTF = /resetsig
150
151         data_bus_5.CLKF = noiseclock
152         data_bus_4.D := data_bus_3 * /readysig_delay + data_bus_4 * readysig_delay
153         /data_bus_4.RSTF = /resetsig
154
155         data_bus_4.CLKF = noiseclock
156
157     ; RNG.3.1.4.1.2
158
159         data_bus_3.D := data_bus_2 * /readysig_delay + data_bus_3 * readysig_delay
160         /data_bus_3.RSTF = /resetsig
161
162         data_bus_3.CLKF = noiseclock
163         data_bus_2.D := data_bus_1 * /readysig_delay + data_bus_2 * readysig_delay
164         /data_bus_2.RSTF = /resetsig
165
166         data_bus_2.CLKF = noiseclock
167         data_bus_1.D := data_bus_0 * /readysig_delay + data_bus_1 * readysig_delay
168         /data_bus_1.RSTF = /resetsig
```

```
169
170         data_bus_1.CLKF = noiseclock
171         data_bus_0.D := clkdata * /readysig_delay + data_bus_0 * readysig_delay
172         /data_bus_0.RSTF = /resetsig
173         data_bus_0.CLKF = noiseclock
174
175   ; RNG.3.1.4.2.1
176
177         bus_out_7_ = chipsel * /portaddr_1_ * /portaddr_0_ * data_bus_7
178             :+: portaddr_1_ * bus_out_7_ + /chipsel * bus_out_7_
179
180         bus_out_6_ = chipsel * /portaddr_1_ * /portaddr_0_ * data_bus_6
181             :+: portaddr_1_ * bus_out_6_ + /chipsel * bus_out_6_
182
183         bus_out_5_ = chipsel * /portaddr_1_ * /portaddr_0_ * data_bus_5
184             :+: portaddr_1_ * bus_out_5_ + /chipsel * bus_out_5_
185
186         bus_out_4_ = chipsel * /portaddr_1_ * /portaddr_0_ * data_bus_4
187             :+:portaddr_1_ * bus_out_4_ + /chipsel * bus_out_4_
188
189   ; RNG.3.1.4.2.2
190
191         bus_out_3_ = chipsel * /portaddr_1_ * /portaddr_0_ * data_bus_3
192             :+: portaddr_1_ * bus_out_3_ + /chipsel * bus_out_3_
193
194         bus_out_2_ = chipsel * /portaddr_1_ * /portaddr_0_ * data_bus_2
195             :+: portaddr_1_ * bus_out_2_ + /chipsel * bus_out_2_
196
197         bus_out_1_ = chipsel * /portaddr_1_ * /portaddr_0_ * data_bus_1
198             :+: portaddr_1_ * bus_out_1_ + /chipsel * bus_out_1_
199
200         bus_out_0_ = chipsel * /portaddr_1_ * /portaddr_0_ * data_bus_0
201             :+: readysig * chipsel * /portaddr_1_ *
202             portaddr_0_ + portaddr_1_ * bus_out_0_ + /chipsel * bus_out_0_
203
204   ; RNG.3.1.4.3
205
206         pc_data_bus_7_ = bus_out_7_ * readysig
207         pc_data_bus_7_.TRST = chipsel * /portaddr_1_ * enablesig
208
209         pc_data_bus_6_ = bus_out_6_ * readysig
210         pc_data_bus_6_.TRST = chipsel * /portaddr_1_ * enablesig
211
212         pc_data_bus_5_ = bus_out_5_ * readysig
213         pc_data_bus_5_.TRST = chipsel * /portaddr_1_ * enablesig
214
215         pc_data_bus_4_ = bus_out_4_ * readysig
216         pc_data_bus_4_.TRST = chipsel * /portaddr_1_ * enablesig
217
218         pc_data_bus_3_ = bus_out_3_ * readysig
219         pc_data_bus_3_.TRST = chipsel * /portaddr_1_ * enablesig
220
221         pc_data_bus_2_ = bus_out_2_ * readysig
222         pc_data_bus_2_.TRST = chipsel * /portaddr_1_ * enablesig
223
224         pc_data_bus_1_ = bus_out_1_ * readysig
```

```
225     pc_data_bus_1_.TRST = chipsel * /portaddr_1_ * enablesig
226
227     pc_data_bus_0_ = bus_out_0_ * readysig
228     pc_data_bus_0_.TRST = chipsel * /portaddr_1_ * enablesig
229
230  ; End of File
```

We claim:

1. A circuit for generating a nonreproducible, nonperiodic sequence of values, comprising:

a noise source;

means for generating timing signals from the noise source;

an independent free-running multistate digital circuit having a predetermined distribution of states; and buffering means for storing states of the digital circuit at random times in accordance with the timing signals.

2. The circuit according to claim 1, wherein the noise source comprises an amplifier circuit.

3. The circuit according to claim 2, wherein the noise source further comprises a bandpass filter circuit.

4. The circuit according to claim 1, wherein the noise source includes means for generating an analog noise signal, and wherein the means for generating timing signals includes a circuit for converting the analog noise signal to a digital noise signal.

5. The circuit according to claim 4, wherein the means for generating timing signals further comprises a circuit for generating an output signal having pulses with known widths.

6. The circuit according to claim 5, wherein the means for generating timing signals further comprises a circuit for synchronizing the phase of the output signal with a clock signal.

7. The circuit according to claim 1, wherein the multistate digital circuit includes means for running continuously and repeatedly through the predetermined distribution of states.

8. The circuit according to claim 1, wherein the multistate digital circuit comprises a flip-flop driven by a clock signal.

9. The circuit according to claim 1, wherein the buffering means comprises a register for storing states of the digital circuit as bits.

10. The circuit according to claim 1, further comprising output means for transferring the states stored in the buffering means when the buffering means has stored a predetermined number of states.

11. The circuit according to claim 10, further comprising reset means for resetting the buffering means after the states stored in the buffering means have been transferred to the output means.

12. An apparatus for generating random numbers, comprising:

means for continuously activating each one of a plurality of states;

means for generating timing signals based on random variations in naturally-occurring noise;

means for sampling values of active states in accordance with the timing signals; and means for storing the sampled values as bits of random numbers.

13. The apparatus according to claim 12, wherein the naturally-occurring noise comprises electrical noise.

14. A method of generating random numbers, comprising the steps of:

generating timing signals from a noise source;

continuously activating states of a predetermined distribution of states; and storing values of active states in accordance with the timing signals.

15. The method according to claim 14, further comprising the step of providing electrical noise from a noise source.

16. The method according to claim 15, wherein the timing signals are generated from random variations in the electrical noise.

17. The method according to claim 14, wherein the timing signals randomly trigger when values of active states are stored.

18. The method according to claim 14, further comprising the step of grouping sets of the stored values to form bytes of random numbers.

19. A set of numbers generated by a method comprising the steps of:

generating timing signals from random variations in electrical noise;

continuously activating states of a predetermined distribution of states; and storing values of active states in accordance with the timing signals.

20. A medium storing a set of numbers generated by a method comprising the steps of:

generating timing signals from random variations in electrical noise;

continuously activating states of a predetermined distribution of states; and storing values of active states in accordance with the timing signals.

* * * * *